United States Patent
Egawa

(12) 
(10) Patent No.: US 6,289,481 B1
(45) Date of Patent: Sep. 11, 2001

(54) MULTI-VALUE TYPE SEMICONDUCTOR MEMORY DEVICE AND ITS DEFECT REMOVAL METHOD

(75) Inventor: Tonomi Egawa, Kanagawa (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/263,209

(22) Filed: Mar. 5, 1999

(30) Foreign Application Priority Data

Mar. 5, 1998 (JP) .................................................. 10-053523

(51) Int. Cl.$^7$ ........................................................ G06F 11/00
(52) U.S. Cl. ............................................. 714/746; 714/758
(58) Field of Search ..................... 360/72.2; 365/185.03; 714/773, 721, 746, 758

(56) References Cited

U.S. PATENT DOCUMENTS

| | | | |
|---|---|---|---|
| 4,949,200 | * 8/1990 | Weng | 360/72.2 |
| 5,450,363 | 9/1995 | Christopherson et al. | 365/205 |
| 5,621,682 | * 4/1997 | Tanzawa et al. | 365/185.03 |
| 5,754,566 | * 5/1998 | Christopherson et al. | 714/773 |
| 5,859,858 | * 1/1999 | Leeman | 714/721 |
| 5,889,698 | * 3/1999 | Miwa et al. | 365/185.03 |

FOREIGN PATENT DOCUMENTS

| | | |
|---|---|---|
| 9-69295 | 3/1997 | (JP) . |
| WO 95/34075 | 12/1995 | (WO) . |
| WO 98/10425 | 3/1998 | (WO) . |

OTHER PUBLICATIONS

European Search Report dated Dec. 7, 2000.
European Search Report dated Jul. 1, 1999.

* cited by examiner

Primary Examiner—Albert Decady
Assistant Examiner—David Ton
(74) Attorney, Agent, or Firm—McGinn & Gibb, PLLC

(57) ABSTRACT

The data to be saved by the ECC are grouped into lower digit data and higher digit data as outputs of a binary circuit, and by saving in the ECC circuit in the first established data input sequence, it is possible to save by the ECC in every lower and higher digit data delivered before reading out all data, so that the saving process time is shortened.

9 Claims, 8 Drawing Sheets

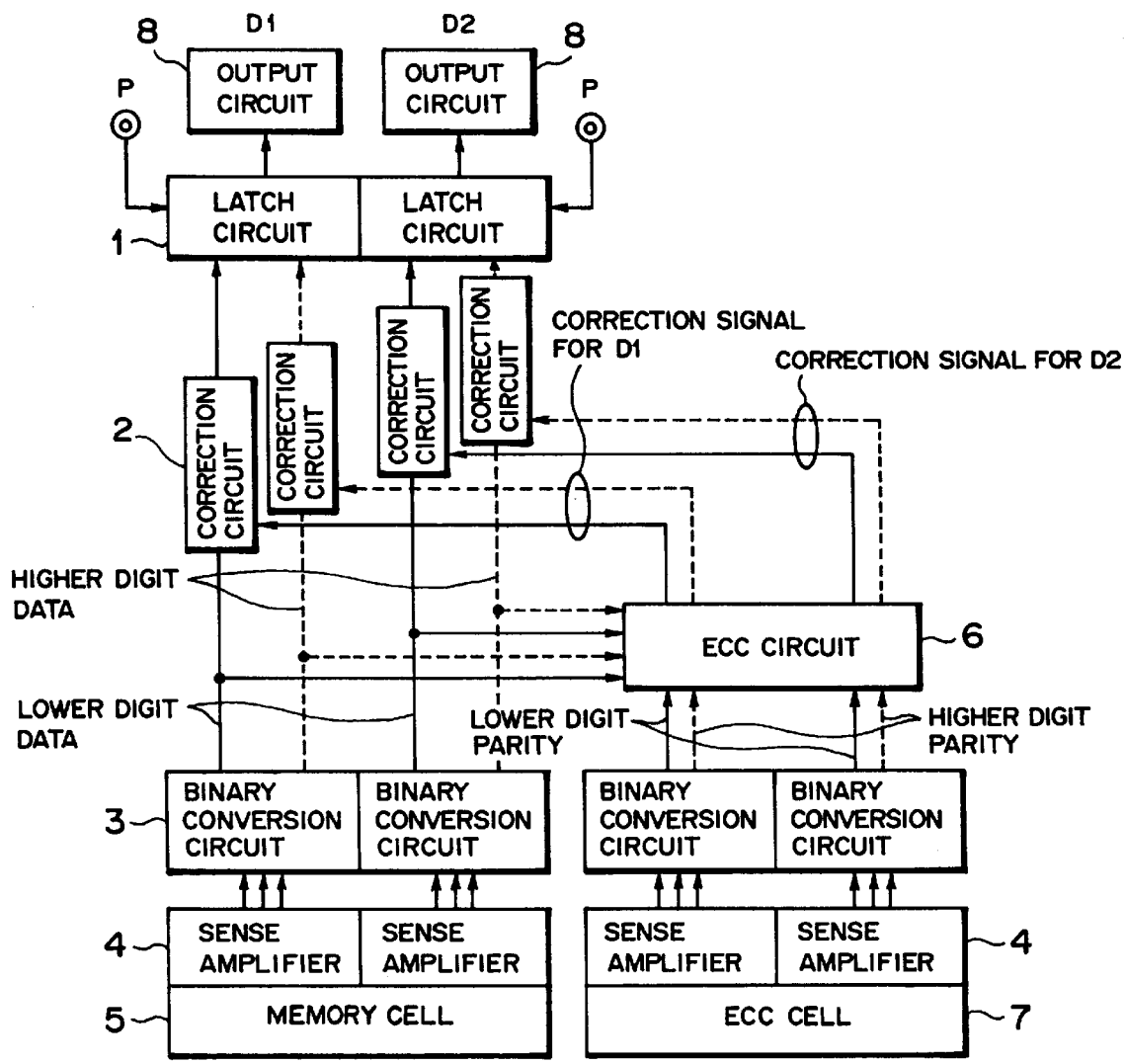

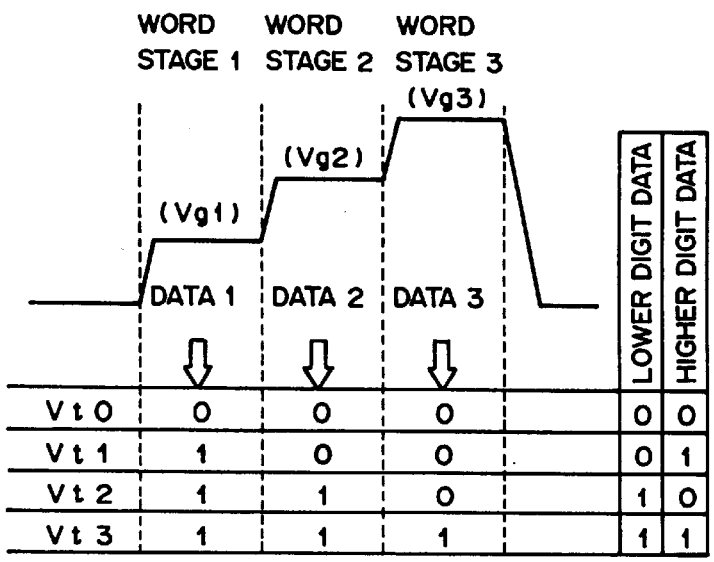
FIG. 2A
(PRIOR ART)
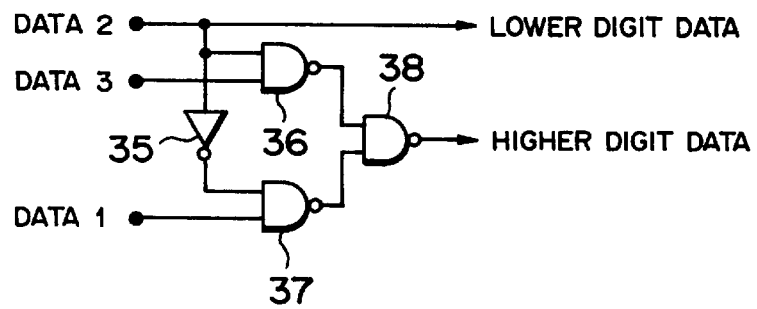
FIG. 2B
(PRIOR ART)
FIG. 3
(PRIOR ART)
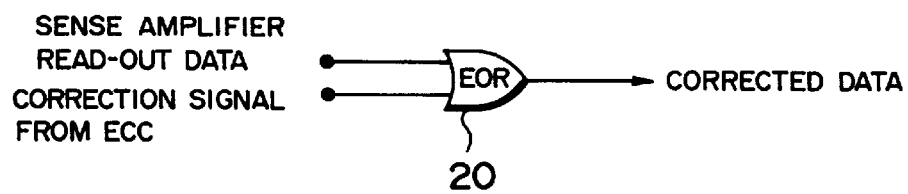

US 6,289,481 B1

MULTI-VALUE TYPE SEMICONDUCTOR MEMORY DEVICE AND ITS DEFECT REMOVAL METHOD

BACKGROUND OF THE INVENTION

1. Field of the Invention

The present invention relates to a multi-value type semiconductor memory device and its defect removal method.

2. Prior Art

To enhance the production yield, many semiconductor memory devices incorporating ECC (Error Correcting Code) circuits as means of saving from defective bits have been proposed and used, and are greatly contributing to mass production.

On the other hand, there is an increasing demand for larger memory capacity, and various memory devices of multi-value type having a double capacity of the conventional memory cell by writing two-bit information in one memory cell have been proposed.

FIG. 1 is a block diagram of an example of using ECC circuit as defective bit removal method in a conventional multi-value type memory. In the diagram, in this cell 5, data is written in multi-value system, and it is supposed that two-bit information is written in one memory cell. As this method of writing, hitherto, several methods have been disclosed, and it is supposed herein that the threshold level of the memory cell is adjusted. More specifically, the two-bit data is data worth two words for one output bit, and the data held in a latch circuit 1 is selected by a page changeover signal p, and data D1 and D2 are outputted from an output circuit 8.

On the other hand, in an ECC cell 7, data is written in multi-value system, and the data written in this ECC cell 7 is written according to the ECC method known well as Hamming code. Generally, for n-bit data length, the number of parity bits P necessary for detecting and correcting an error of one bit is expressed in the following formula (1).

$$2P \geq (n+1) \quad (1)$$

For example, in the case of an output data length of four bits, the number of parity bits required for detecting and correcting an error of one bit is 3 bits.

Herein, referring to FIG. 1, the operation of this circuit is described below. In this cell 5, a multi-value level written in the memory cell by two sense amplifiers 4 is read by three data lines, and these three pieces of data are sent into a binary conversion circuit 3, and they are converted into two-bit data individually in this binary conversion circuit 3. Now, the bit length to be corrected is 4 bits, which requires 3 bits of parity. Accordingly, the ECC cell 7, same as this cell 5, has two sense amplifiers, and four-bit data is outputted from the binary conversion circuit 3. At this time, one piece of output data is unnecessary data. By entering four bits of conversion data of this cell 5 and three bits of conversion data of the ECC cell 7 into the ECC circuit 6, an error is detected, and an error correction signal is generated. The error correction signal is put into an error correction circuit 2 corresponding to each output, and only the data of the output bit in which error is detected is corrected, and all data is held in a latch circuit 1.

The binary conversion circuit 3, correction circuit 2, and ECC circuit 6 used in this circuit are described below while referring to FIGS. 2A and 2B, 3 and 4, respectively. FIG. 2A is a diagram showing correspondence of multi-value level and binary data for converting four-value level into binary data, as an example of the binary conversion circuit 3, and FIG. 2B is a circuit diagram of its conversion circuit.

When writing two-bit data by controlling the threshold of the memory cell and writing data, as shown in FIG. 2A, gate voltages Vg1 to Vg3 sequentially applies three gate voltage levels Vg, for reference voltages Vt0, Vt1, Vt2, Vt3, in the relation of Vt0<Vg1<Vt1<Vg2<Vt2<Vg3<Vt3.

First, when gate voltage Vg1 is applied, the cells written at reference voltage Vt0 are turned on, but other cells written at other threshold remain in off state at this stage. Next, when the level is changed to gate voltage Vg2, the cells written at reference voltage Vt0, Vt1 are turned on, but other cells written at other threshold remain in off state. When changed to the level of gate voltage Vg3, similarly, all cells but cells written at reference voltage Vt3 are turned on.

Herein, FIG. 2A shows the correspondence between this state and the data of output bits, in which multi-value levels of the memory cells are read out in three data lines (1 to 3) by the sense amplifier 4, and converted into two-bit higher and lower digit data by the binary conversion circuit 3. That is, when all data lines 1 to 3 are 0, the higher and lower digit data are 00, when data lines 1 to 3 are 100, higher and lower digit data are 01, . . . , and when data lines 1 to 3 are 111, higher and lower digit data are 11.

In this case, the binary conversion circuit 3 is composed of inverter 35, and NAND circuits 36 to 38 as shown in FIG. 2B, data 2 is lower digit data, and the logic output by NAND 36 to 38 of data 1, 3 and data 2, and its inverted output is the higher digit data.

The correction circuit 2 is composed of an exclusive OR (EOR) 20 as shown in a circuit diagram in FIG. 3, and correction signals D1, 2 from the ECC circuit 6 are entered in one input of the EOR 20, and data from the binary conversion circuit 3 is entered in other input, and when the correction signals D1, 2 are 1, the input data is inverted and outputted, and when the correction signals D1, 2 are 0, the input data is directly outputted.

Further, the ECC circuit 6 comprises, as shown in a circuit diagram in FIG. 4, OR 101 to 103 for calculating the OR logic of parity data 0 to 2 and the higher and lower digit data of sense amplifier 4 (0,1), NAND 111 to 114 for calculating the NAND of these OR outputs and outputs of their outputs through inverters 104 to 110, and OR 115 to 118 for calculating the OR of these outputs of the NAND 111 to 114 and the higher and lower digit data of sense amplifier 4 (0,1), and outputs of the OR 115 to 118 are correction outputs.

In the multi-value type memory explained above, the operation timing is summarized in the operation waveform diagram in FIG. 5. First, lower digit data and lower digit parity data to which the data is directly outputted are entered, and higher digit data and high digit parity data are entered from the binary conversion circuit 3 at time t11, and at this time, a correction signal is outputted (t12), and correction output data from the correction circuit 2 is obtained (t13), then by its output, a latch control signal P is outputted, and the terminal point (t14) is the latch timing of upper/lower digit data.

In this multi-value type memory, however, there is a problem in the data conversion timing of multi-value type memory. That is, same as in the prior art, when writing two-bit data by controlling the threshold of the memory cell and writing data in, three levels Vg are sequentially applied in the relation of Vt0<Vg1<Vt1<Vg2<Vt2<Vg3<Vt3, but in the multi-value type memory, since it is required to detect the changes of these three stages by the sense amplifier 4 and convert into two-bit data in the binary conversion circuit 3, output cannot be outputted to outside until all data is established (t11 in FIG. 5), and error correction by the ECC circuit 2 cannot be done. As a result, the access time is long.

Besides, if the defective bit removal method by the ECC circuit 2 is applied in this multi-value type memory, as compared with the ordinary cell system, the saving rate is lowered. The reason is as follows: in the ordinary memory cell of one bit and one cell system, the data being read out from one bit of memory cell is either 1 or 0, and if there is one defective memory cell, in case one bit is defective, the error can be corrected by the ECC circuit. By contrast, in the multi-value type memory, if defect occurs in one memory cell, the data being read out from one memory cell is a plurality, and therefore if one memory cell is defective, plural pieces of data may be defective, and hence the defective bit may not be removed by the ECC circuit 2.

SUMMARY OF THE INVENTION

It is an object of the present invention to provide a multi-value type semiconductor memory device capable of shortening the access time and removing defective bits by ECC circuit, and its defect removal method.

A multi-value type semiconductor device of the present invention comprises a multi-value type memory having plural memory means for judging voltage values stored in one memory cell by plural reference voltage levels and obtaining output data, a binary conversion circuit for converting output data from the multi-value type memory into binary data, an ECC circuit for inputting plural pieces of data from the binary conversion circuit, issuing plural pieces of data, and detecting one error out of these plural pieces of output data, a correction circuit for correcting the error data into correct data by the output of the ECC circuit, storing and converting circuit for dividing plural pieces of data written in the one memory cell into a higher digit data group and a lower digit data group, and reading out the lower digit data group first, and a defect removal circuit for detecting error and correcting by dividing into each one of plural lower digit data groups and plural higher digit data groups.

In the present invention, the defect removal circuit of the higher digit data group and lower digit data group is provided individually, the defect removal circuit of the higher digit data group and lower digit data group is provided by dividing into each one of the plural lower digit data groups and plural higher digit data groups, and moreover the binary conversion circuit is composed of a circuit for converting the data of voltage level into gray code according to the voltage sequence.

A defect removal method of a multi-value type semiconductor device of the present invention comprises a step of dividing plural pieces of data written in the one memory cell into a higher digit data group and a lower digit data group, a step of reading the lower digit data group first, a step of reading the upper digit data group next, and a step of detecting error and correcting in the data output sequence in each one of such lower digit data group and upper digit data group.

Further, in the defect removal method, by changing over the higher digit data group and lower digit data group individually by a control signal, and removing defect in the lower digit data group, and removing defect later in the higher digit data group, each defect removal circuit is used commonly.

In the multi-value type semiconductor memory device of the invention, by dividing the data being read out from the sense amplifier and outputted from the binary conversion circuit into lower digit data and higher digit data, and inputting individually into the ECC circuit, if one memory cell becomes defective due to breakdown or the like, it is effective to save from defect by the ECC so that lowering of the ECC saving rate of the data being read out can be prevented.

Moreover, since the assignment of the state being written into the memory cell and the expected value of the data after conversion is divided into the higher digit data and lower digit data, the ECC saving process can be executed in the data reading sequence, and the time from start of reading operation till start of output of data saved in the ECC circuit from the output circuit can be shortened. That is, the data output sequence starts from the output of the data first read out and saved by the ECC, so that output of data can be started earlier.

Moreover, the higher digit data and lower digit data being read out can be commonly saved in a same ECC circuit, and the ECC circuit scale may be limited to a minimum extent, and the circuit scale is not variable but constant if the quantity of data being read out per one memory cell increases, and when saving the same number of pieces of data, as compared with the memory device not using multi-value type memory, the ECC circuit scale may be equal or smaller.

BRIEF DESCRIPTION OF THE DRAWINGS

FIG.1 is a block diagram of a conventional multi-value type semiconductor memory device;

FIGS. 2A and 2B are a diagram showing the correspondence of multi-value level and binary data for converting multi-value level into binary data in FIG. 1, and a circuit diagram of its binary conversion circuit 3, respectively;

FIG. 3 is a circuit diagram of an example of a correction circuit 2 in FIG. 1;

DESCRIPTION OF THE PREFERRED EMBODIMENTS

Figure 4:
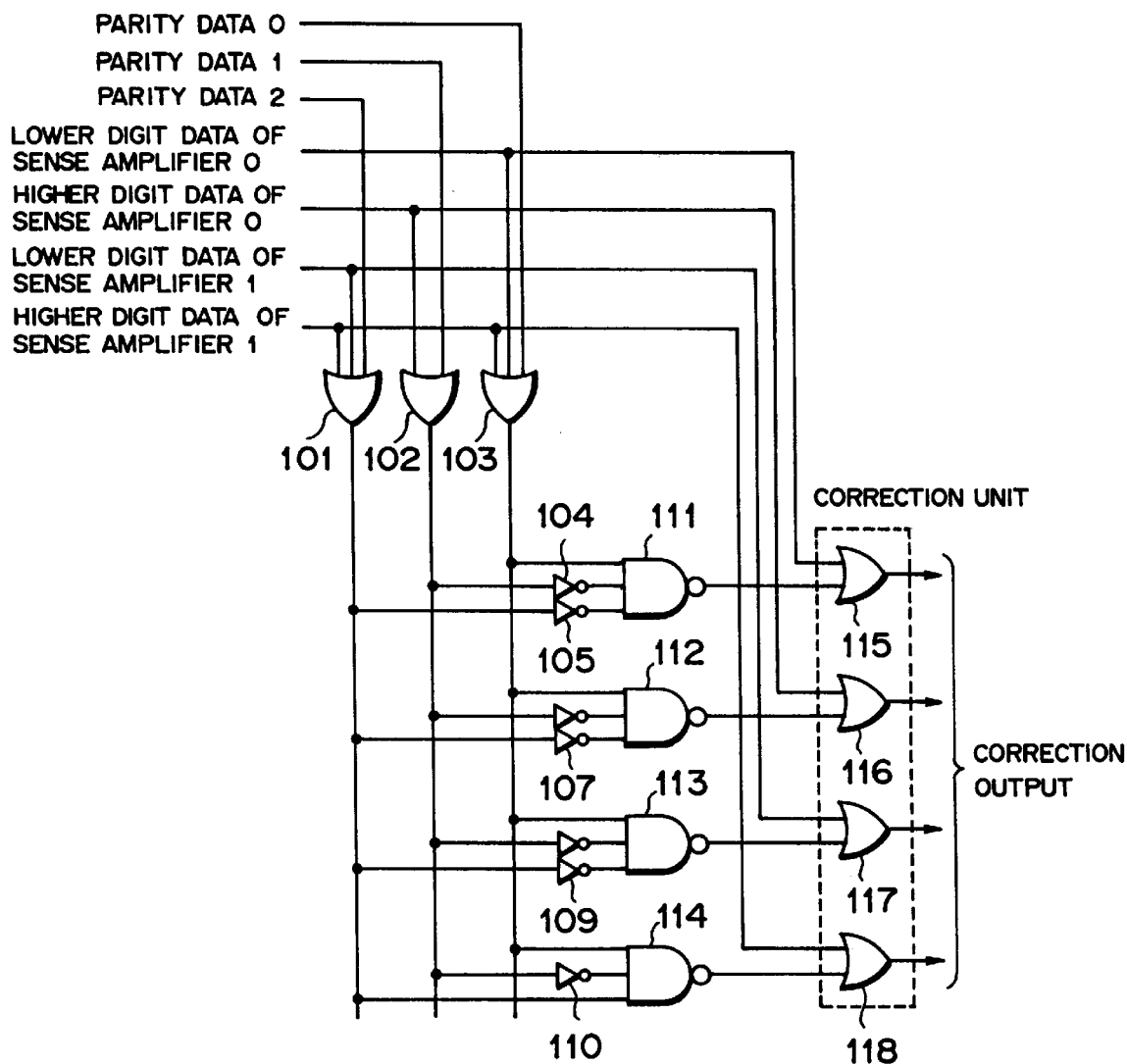
FIG. 4 is a circuit diagram showing an example of ECC circuit 6 in FIG. 1.
Figure 5:
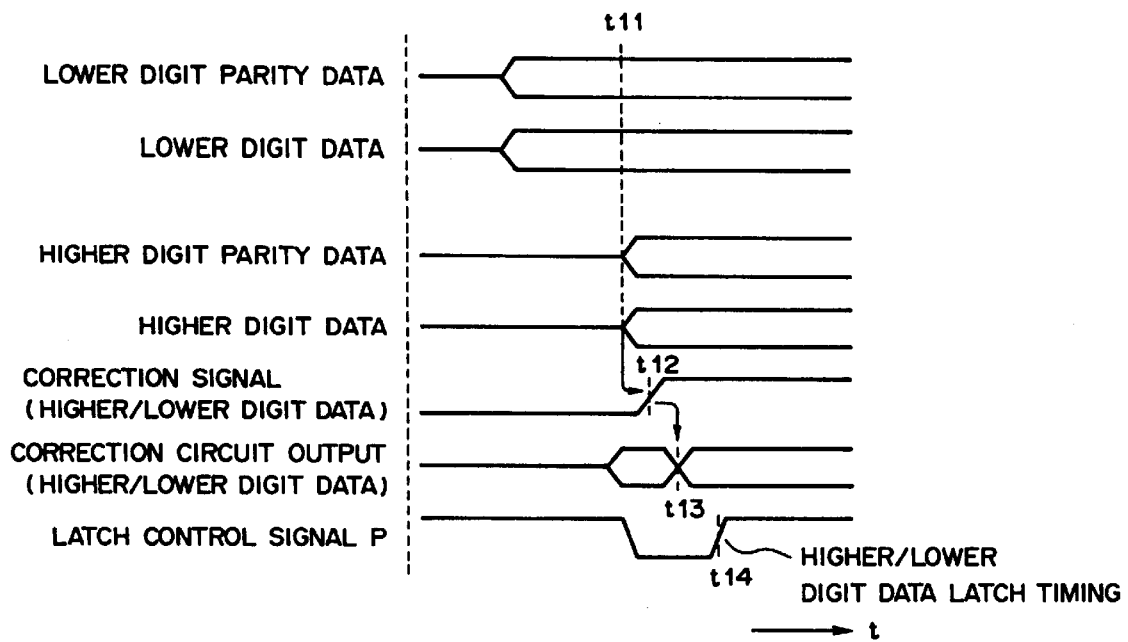
FIG. 5 is an operation waveform diagram explaining the operation of the circuit in FIG. 1.
Figure 6:
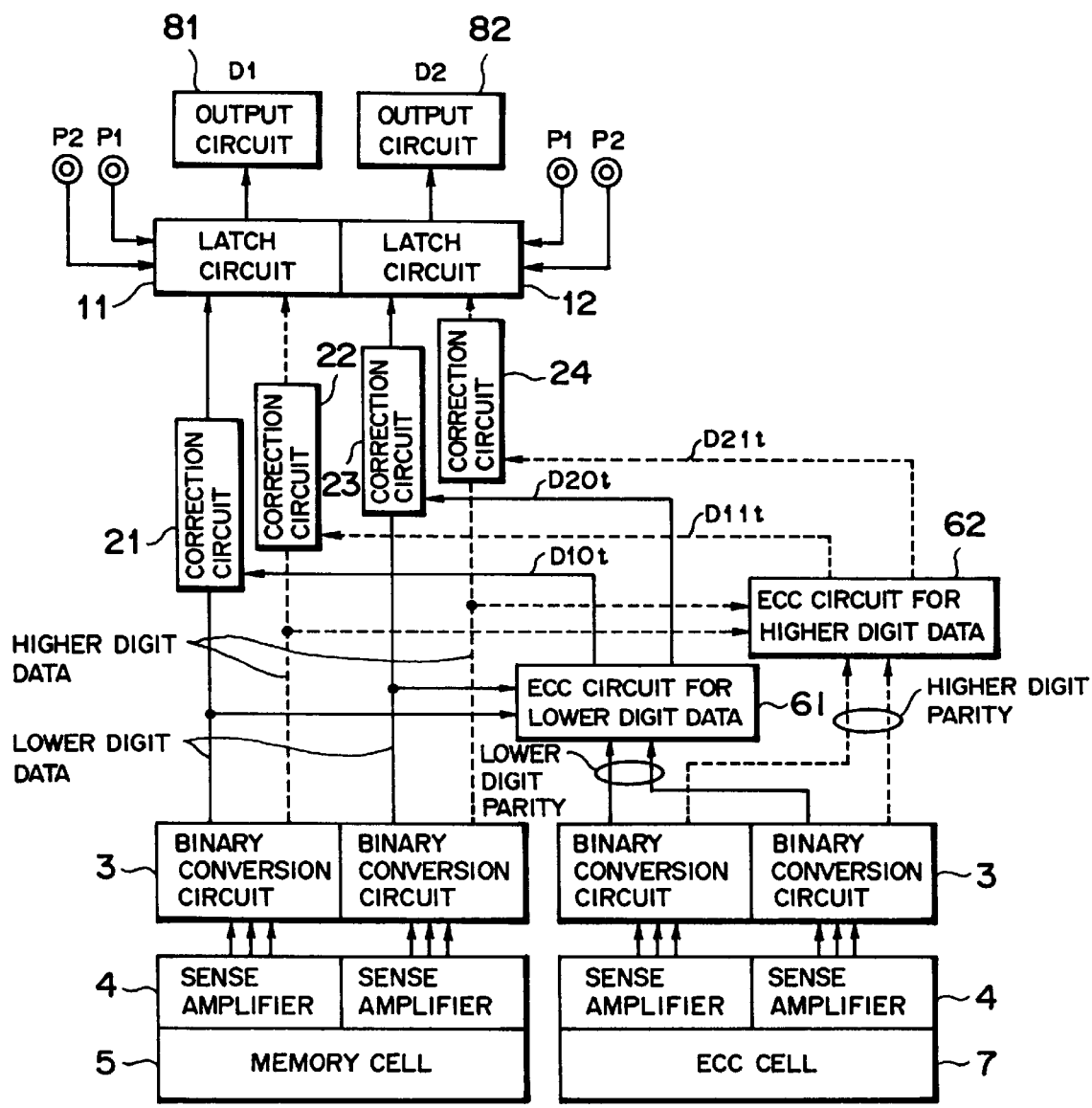
FIG. 6 is a block diagram showing a multi-value type semiconductor memory device in a first embodiment of the present invention.
Figure 7A:
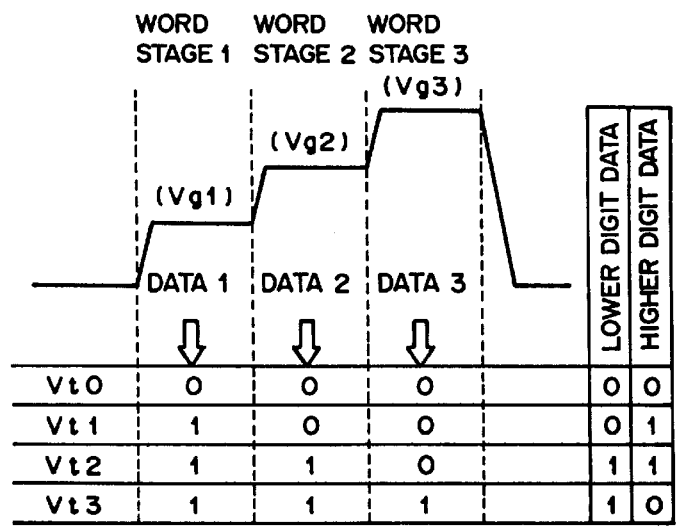
FIGS. 7A and 7B are a diagram showing the correspondence of multi-value level and binary data for converting multi-value level into binary data in FIG. 6, and a circuit diagram of its binary conversion circuit 3, respectively.
Figure 7B:
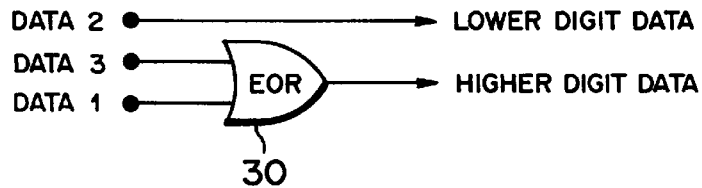
Figure 8:
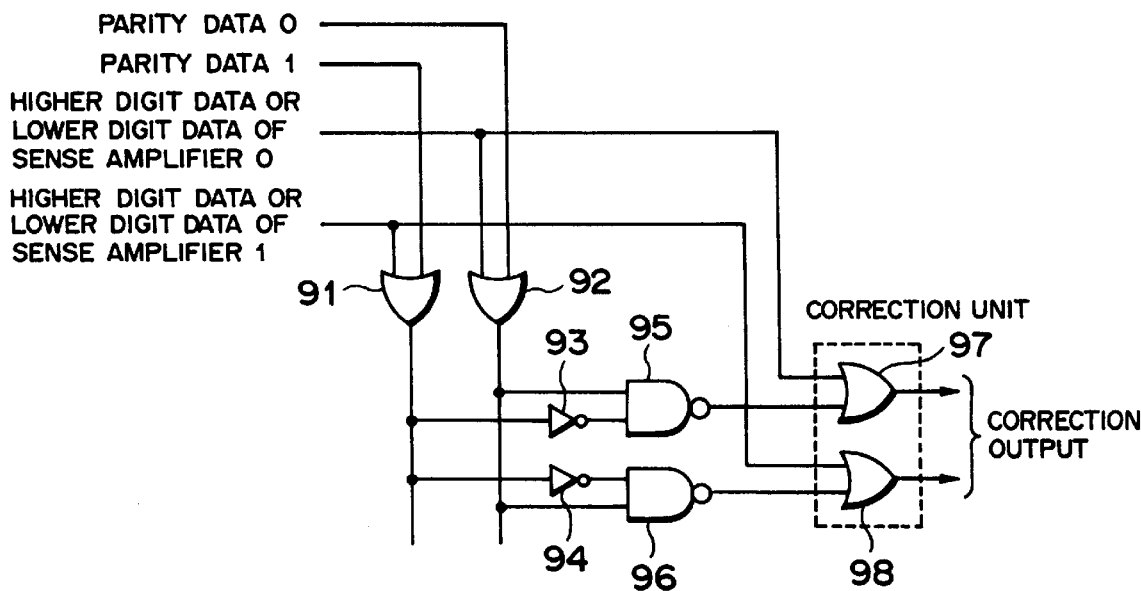
FIG. 8 is a circuit diagram showing an example of ECC circuit 6 in FIG. 6.
Figure 9:
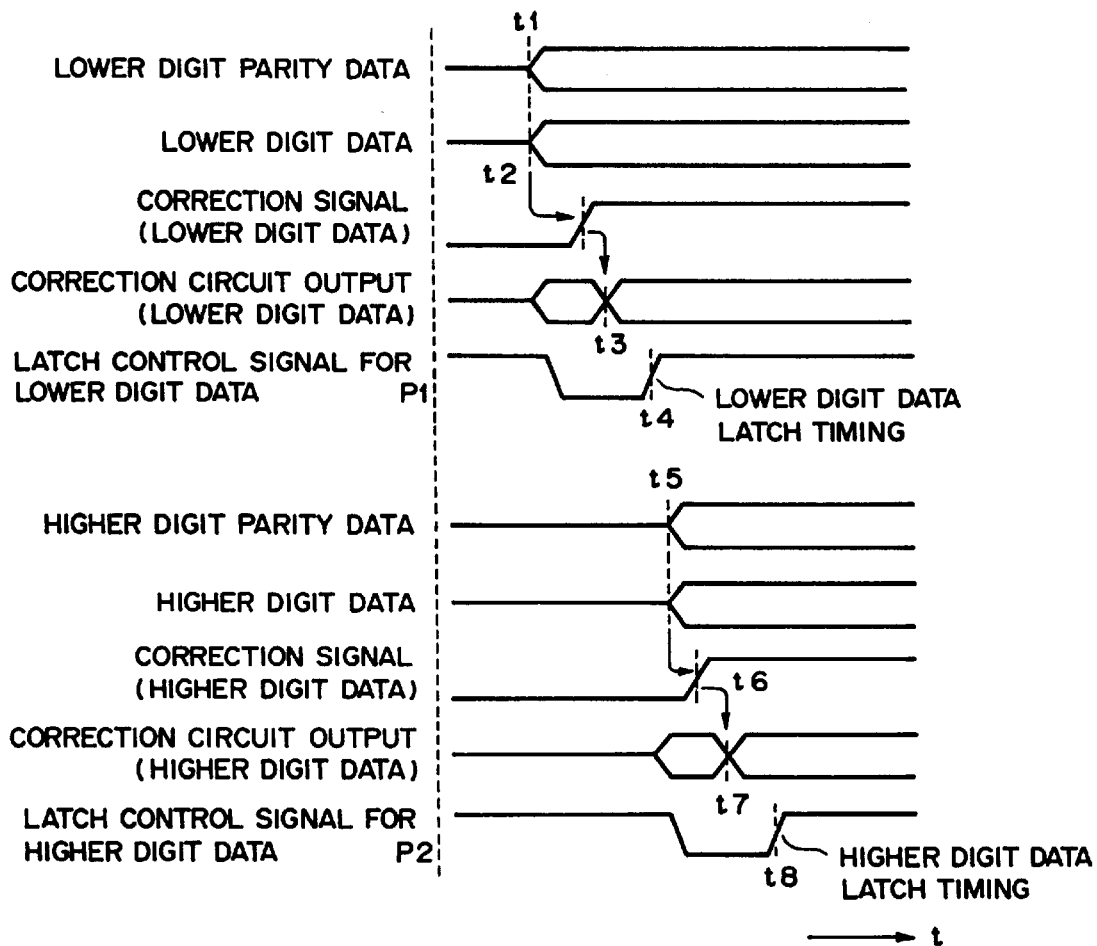
FIG. 9 is an operation waveform diagram explaining the operation of the circuit in FIG. 6.

A preferred embodiment of the present invention is described below. FIG. 6 is a block diagram showing a multi-value type semiconductor memory device in a first embodiment of the invention, FIGS. 7A and 7B are a diagram showing the correspondence of multi-value level and binary data for converting multi-value level into binary data in FIG. 6, and a circuit diagram of its binary conversion circuit 3, respectively, FIG. 8 is a circuit diagram showing an example of ECC circuit 6 in FIG. 6, and FIG. 9 is a operation waveform diagram explaining the operation of the circuit in FIG. 6. In this embodiment, instead of the ECC circuit 6 in the prior art, an ECC circuit 61 for higher digit data and an ECC circuit 62 for lower digit data are used, and moreover the correction circuit 2 is composed of correction circuits 21 to 24, the latch circuit 1 is composed of latch circuits 11, 12, and the output circuit 8 is composed of output circuits 81, 82.

In this embodiment, as the multi-value, output data is assigned for four states of threshold as shown in FIG. 7A. Herein, the higher and lower digit data of output data to each threshold are exchanged as compared with the case of the prior art shown in FIG. 2A. That is, at the gate voltage level of Vg1, 0 and 1 are distinguished by the memory cell having the threshold of Vt0 and the memory cell having the threshold of Vt1 to vt3, at the gate voltage level of Vg2, 0 and 1 are distinguished by the memory cell having the threshold of Vt0, Vt1 and the memory cell having the threshold of Vt2, Vt3, and at the gate voltage level of Vg3, 0 and 1 are distinguished by the memory cell having the threshold of Vt0 to Vt2 and the memory cell having the threshold of Vt3.

Therefore, when changing the gate voltage level Vg1 to Vg2 to Vg3 sequentially, at the gate voltage level of Vg2, 0 and 1 can be distinguished by the memory cell having the threshold of Vt0, Vt1 and the memory cell having the threshold Vt2, Vt3, and this output can be directly applied as the lower digit data, and the data output may be enabled before reaching the threshold level of Vg3. The code of this embodiment corresponds to the gray code.

As for the parity bits in the ECC circuits 61, 62, by the exclusive OR of higher and lower digit data of each output bit, hitherto, data were written in the parity bits, that is, the ECC cell 7, and error was detected in the ECC cell 6, but in this embodiment, results of exclusive OR of 25 mutual higher digit data of each output bit and exclusive OR of mutual lower digit data of each output bit are written into one ECC cell 7.

In the defect removal method of the embodiment, the ECC circuit is provided separately in the higher and lower digit data to save from defect, which is fundamentally different from the prior art, and in FIG. 1 it is designed to remove defect independently in the ECC circuits 61, 62 by the ECC circuit 62 for higher digit data and ECC circuit 61 for lower digit data.

According to FIG. 7A, as the gate voltage Vg1 of the memory cell has been already applied, when the data established state is changed to the level of Vg2, the lower digit data is outputted from the binary conversion circuit 3, and similarly the lower parity is also determined. Each signal is fed into the ECC circuit 61 for lower digit data, and outputs are error correction signals D10t, D20t, which are fed into correction circuits 21, 23 for correcting the lower digit data of output bits D1, D2. Herein, for example, if error is detected in the lower digit data of D1, D10t is selected, and only this data is corrected in the correction circuit 21.

Later, when the level of Vg2 is changed to Vg3, three states are already established now, and the higher digit data is established. Similarly, the higher digit parity is established, and the ECC circuit for higher digit data delivers outputs of error correction signals D11t, D21t, so that the higher digit data of the output bits D1, D2 can be corrected.

Herein, error correction is explained. For example, the threshold to be written into the memory cell 5 is Vt1. Suppose the threshold level is lowered due to diffusion problem to drop to level of Vt0. When the gate voltage of the memory cell is Vg2, 0 is outputted according to FIG. 7A, and it coincides with the value 0 of the output data lower digit data, so that it is not judged to be defective in the ECC circuit. When the gate voltage is further changed to level of Vg3, three states are established and 0 is outputted, and it is judged to be error in the ECC circuit for higher digit, and 0 is rewritten to 1 so as to be corrected to a normal output.

Incidentally, although the threshold to be written into the memory cell is Vt3, if the memory cell is broken due to some cause to be in leak state, at the gate voltage level of Vg2, 0 is outputted and judged, but error is judged in the ECC circuit for lower digit, and it is corrected to normal 1. When three states are established at the level of Vg3, similarly, 0 is outputted and judged, but it is corrected to normal 1 by the ECC circuit for higher digit.

The binary conversion circuit 3 in this embodiment is composed of one EOR 30 as shown in FIG. 7B, and data 2 is directly outputted as lower digit data, and the exclusive OR output of data 1 and 3 is outputted as higher digit data. The ECC circuits 61, 62 are, as shown in a circuit diagram in FIG. 8, composed of OR 91, 92 for calculating the OR of parity data 0, 1 and higher and lower digit data of the sense amplifier 4 (0, 1), NAND 95, 96 for calculating the NAND of these OR outputs and their outputs through inverters 93, 94, and OR 97, 98 for calculating the OR of the outputs of these NAND 95, 96 and higher and lower digit data of the sense amplifier (0, 1), and the outputs of the OR 97, 98 are correction outputs.

The operation timing of the embodiment is summarized in the operation waveform diagram in FIG. 9. First, at input timing t1, lower digit data and lower digit parity data are entered from the binary conversion circuit 3, and when a correction signal is outputted at time t2, correction output data is obtained from the correction circuit 2 at time t3, and by its output, a latch control signal p1 for lower digit data is outputted, and its final time t4 if the latch timing of lower digit data. Next, when the upper digit data and lower digit parity data are entered from the binary conversion circuit 3 at time t5, a correction signal is outputted (t6), and correction output data from the correction circuit 2 is obtained (t7), and by its output, a latch control signal p2 for higher digit data is outputted, and its final time (t8) is the latch timing of higher digit data.

In this manner, according to the embodiment, first, the lower digit data and lower digit parity data are supplied from the binary conversion circuit 3 into the ECC circuit 61 through the sense amplifier 4, but since the binary conversion circuit 3 is through and substantially the data is supplied from the sense amplifier 4 directly to the ECC circuit 61, the data is already established. Hence, by making use of this time, first the lower digit data and lower digit parity data are saved by the ECC, and then after the higher digit data and higher digit parity side data are established, the higher digit data and high digit parity data are saved by the ECC. That is, as compared with the prior art for saving by the ECC after completion of reading of all of lower digit data and higher digit data, the lower digit data can be outputted earlier. For example, in a certain multi-value semiconductor memory, the reading time has been shortened by 200 to 300 ns.

Figure 10:
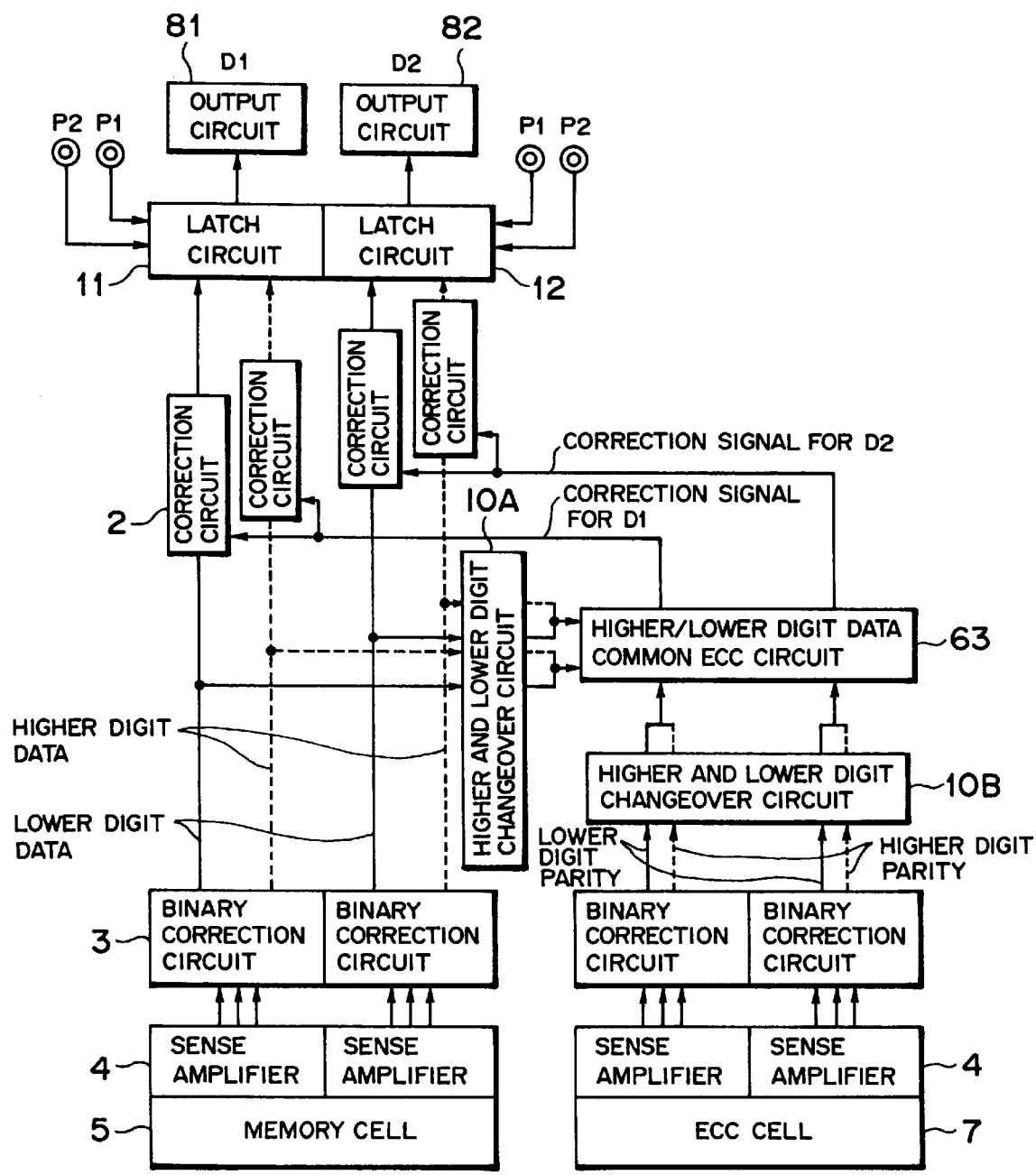
FIG. 10 is a block diagram showing a multi-value type semiconductor memory device in a second embodiment of the present invention.

FIG. 10 is a block diagram showing a multi-value type semiconductor memory device in a second embodiment of the invention. In the circuit of the first embodiment shown in FIG. 6, the ECC circuit scale is larger than the conventional circuit shown in FIG. 1, and hence the ECC circuit 6 for detecting defective data of lower digit data is shared by changing over the input of the ECC circuit 63 to only the lower digit data or higher digit data in the higher and lower digit changeover circuits 10A, B, and the data detected to be defective is corrected in the correction circuit 2, and the output of the correction circuit 2 of the lower digit data is latched by the latch control signal P1 and the higher digit data is latched by the latch control signal P2.

By contrast, in the second embodiment, the lower digit data being read out from the memory cell 5 and memory cell 7 for parity selected by the higher and lower digit changeover circuits 10A, B is transmitted to the ECC circuit 63, and an "H" signal is transmitted from the ECC circuit 63 to the correction circuit 2 receiving the lower digit data judged to be defective in the ECC circuit 63, and the data corrected in the correction circuit 2 is latched in the latch circuit 1 by the latch control signal P1. Next, while the P2 is "L", the higher digit data is changed over in the higher and lower digit changeover circuits 10A, B, and defective data is detected in the ECC circuit 63 same as the lower digit data, and is corrected in the correction circuit 2. The lower digit data established first is corrected in the first place, and after first issuing the lower digit data, the higher digit data is corrected and outputted outside.

In this embodiment, the higher digit data and lower digit data being read out can be commonly saved in the same ECC circuit 63, and the scale of the ECC circuit may be limited to a minimum, and the circuit scale is not changed but remains the same if the data being read out per one memory cell increases, and when removing defects from the same number of pieces of data, the ECC circuit scale is same as or smaller than the memory device not using the multi-value type memory.

What is claimed is:

1. A multi-value type semiconductor device comprising:
   a multi-value type memory having plural memory portions judging voltage values stored in a memory cell by plural reference voltage levels and obtaining output data;
   a binary conversion circuit converting output data from said multi-value type memory into binary data,
   an ECC circuit inputting first plural pieces of data from said binary conversion circuit, issuing second plural pieces of data, and detecting an error out of said first plural pieces of data;
   a correction circuit correcting said error; and
   a storing and converting circuit separating said binary data into a higher digit data group and a lower digit data group, and reading out the lower digit data group first.

2. A multi-value type semiconductor device according to claim 1, wherein said error detection and correction is provided separately for said higher digit data group and for said lower digit data group.

3. A multi-value type semiconductor device according to claim 1, wherein said error detection and correction is provided by dividing said binary data into said lower digit data group and higher digit data group.

4. A multi-value type semiconductor device according to claim 1, wherein said binary conversion circuit comprises a circuit for converting the data of voltage level into gray code according to the voltage sequence.

5. A defect removal method of a multi-value type semiconductor device comprising a multi-value type memory having plural memory portions judging voltage values stored in a memory cell by plural reference voltage levels and obtaining output data, a binary conversion circuit converting output data from said multi-value type memory into binary data, an ECC circuit inputting first plural pieces of data from said binary conversion circuit, issuing second plural pieces of data, and detecting an error out of said first plural pieces of binary data, and a correction circuit correcting said error data, said method comprising:
   dividing plural pieces of data written in said one memory cell into a higher digit data group and a lower digit data group;
   reading the lower digit data group first;
   reading the upper digit data group next; and
   detecting error and correcting in the data output sequence in each one of said lower digit data group and said higher digit data group.

6. A defect removal method of a multi-value type semiconductor device comprising a multi-value type memory having plural memory portions judging voltage values stored in a memory cell by plural reference voltage levels and obtaining output data, a binary conversion circuit converting output data from said multi-value type memory into binary data, an ECC circuit inputting first plural pieces of data from said binary conversion circuit, issuing second plural pieces of data, and detecting an error out of said first plural pieces of binary data, and a correction circuit correcting said error data, said method comprising:
   dividing plural pieces of data written in said one memory cell into a higher digit data group and a lower digit data group;
   reading the lower digit data group first,
   reading the upper digit data group next; and
   detecting error and correcting in the data output sequence in each one of said lower digit data group and said higher digit data group,
   wherein said detecting error and correcting comprises:
      changing over said higher digit data group and said lower digit data group individually by a control signal, so as to remove first any defect in said lower digit data group and removing afterwards any defect in said higher digit data group, wherein each defect removal circuit is used commonly.

7. An error correction method of a multi-value type semiconductor memory storing a plurality of four-bit data words ABCD and a plurality of corresponding four-bit error correcting code (ECC) words EFGH, such that each said four-bit data word ABCD is stored in two multi-value memory cells representing AB and CD, respectively, and each said four-bit ECC word EFGH is stored in two multi-value memory cells representing EF and GH, respectively, said method comprising:
   converting each said memory cell contents from a multi-value voltage level into a corresponding two-bit binary word AB,CD,EF,GH;
   separating said two-bit binary words into lower digit bits A and C, higher digit bits B and D, lower digit parity bits E and G and higher digit parity bits F and H; and
   detecting and correcting errors based on processing said lower digits bits A and C in combination with said lower digit parity bits E and G separately from processing said higher digit bits B and D in combination with said higher digit parity bits F and H.

8. The method of claim 7, wherein said lower digits bits A and C and said lower digit parity bits E and G are processed prior to processing said higher digit bits B and D and said higher digit parity bits F and H.

9. An error correction method of a multi-value type semiconductor memory, said memory storing at each of a plurality of memory locations a plurality of two-bit data words and a plurality of corresponding two-bit error correcting code (ECC) words, said method comprising:

converting each said two-bit data word and each said corresponding two-bit ECC word from a multi-value voltage level into a corresponding two-bit binary word;

separating said two-bit binary words into a lower digit group comprising lower digit bits and lower digit parity bits and a higher digit group comprising higher digit bits and higher digit parity bits; and detecting and correcting errors based on processing said lower digits group separately from processing said higher digit group, wherein said lower digit group is processed before said higher digit group.

* * * * *